US010991646B2

(12) United States Patent
Min et al.

(10) Patent No.: US 10,991,646 B2
(45) Date of Patent: Apr. 27, 2021

(54) FLEXIBLE CIRCUIT BOARD FOR DISPLAY

(71) Applicant: SILICON WORKS CO., LTD., Daejeon (KR)

(72) Inventors: Kyung Jik Min, Daejeon (KR); Ju Young Shin, Daejeon (KR); Ji Hyun Hwang, Daejeon (KR); Jung Bae Yun, Daejeon (KR)

(73) Assignee: Silicon Works Co., Ltd., Daejeon-si (KR)

( * ) Notice: Subject to any disclaimer, the term of this patent is extended or adjusted under 35 U.S.C. 154(b) by 0 days.

(21) Appl. No.: 16/489,889

(22) PCT Filed: Feb. 14, 2018

(86) PCT No.: PCT/KR2018/001934
§ 371 (c)(1),
(2) Date: Aug. 29, 2019

(87) PCT Pub. No.: WO2018/159951
PCT Pub. Date: Sep. 7, 2018

(65) Prior Publication Data
US 2020/0027824 A1 Jan. 23, 2020

(30) Foreign Application Priority Data
Mar. 3, 2017 (KR) .................. 10-2017-0027459

(51) Int. Cl.
*H01L 23/498* (2006.01)
*H01L 21/66* (2006.01)
(Continued)

(52) U.S. Cl.
CPC ...... *H01L 23/49838* (2013.01); *G02F 1/1345* (2013.01); *H01L 22/30* (2013.01);
(Continued)

(58) Field of Classification Search
CPC ................. H01L 22/32; H01L 27/3276; H01L 23/49838; H05K 1/118
See application file for complete search history.

(56) References Cited

U.S. PATENT DOCUMENTS 9,202,411 B2   12/2015 Jung et al.
2016/0197020 A1* 7/2016 Lim .................. H01L 23/49838
                                                  257/48
2016/0218065 A1   7/2016 Ha

FOREIGN PATENT DOCUMENTS

JP    2011114332 A    6/2011
KR    100806885 B1    2/2008
(Continued)

OTHER PUBLICATIONS

International Search Report and Written Opinion; PCT No. PCT/KR2018/001934; dated Jun. 20, 2018.
(Continued)

*Primary Examiner* — Farun Lu
(74) *Attorney, Agent, or Firm* — Polsinelli PC

(57) ABSTRACT

A flexible circuit board for a display, having a chip-on-film structure, is disclosed. A connection pattern which is selected as a first connection pattern among connection patterns connected to panel contact pads does not reach a cutting line and is confined within a product region. As a consequence, the connection pattern selected as the first connection pattern may be prevented from being exposed on a cutting section along the cutting line, and thus, may be prevented from being changed in its electrical property due to penetration of moisture.

12 Claims, 2 Drawing Sheets

(51) Int. Cl.
*H05K 1/11* (2006.01)
*H05K 1/02* (2006.01)
*H01L 27/32* (2006.01)
*H05K 1/14* (2006.01)
*G02F 1/1345* (2006.01)

(52) U.S. Cl.
CPC .......... *H01L 22/32* (2013.01); *H01L 23/4985* (2013.01); *H01L 27/3276* (2013.01); *H05K 1/0268* (2013.01); *H05K 1/11* (2013.01); *H05K 1/118* (2013.01); *H05K 1/14* (2013.01); *H05K 1/142* (2013.01)

(56) References Cited

FOREIGN PATENT DOCUMENTS

| | | |
|---|---|---|
| KR | 100886367 B1 | 3/2009 |
| KR | 20140051004 A | 4/2014 |
| KR | 20140062607 A | 5/2014 |
| KR | 20150078724 A | 7/2015 |
| KR | 20160094503 A | 8/2016 |
| KR | 20170006461 A | 1/2017 |

OTHER PUBLICATIONS

English abstract of KR100886367; retrieved from www.espacenet.com on Aug. 29, 2019.
English abstract of KR20140062607; retrieved from www.espacenet.com on Aug. 29, 2019.
English abstract of KR20150078724; retrieved from www.espacenet.com on Aug. 29, 2019.
English abstract of JP2011114332; retrieved from www.espacenet.com on Aug. 29, 2019.
English abstract of KR100806885; retrieved from www.espacenet.com on Jun. 18, 2019.
English abstract of KR20140051004; retrieved from www.espacenet.com on Jun. 18, 2019.
English abstract of KR20170006461; retrieved from www.espacenet.com on Jun. 18, 2019.
English abstract of KR20160094503; retrieved from www.espacenet.com on Jun. 18, 2019.
Translated International Report and Written Opinion for PCT No. PCT/KR2018/001934.

* cited by examiner

FLEXIBLE CIRCUIT BOARD FOR DISPLAY

TECHNICAL FIELD

Various embodiments generally relate to a flexible circuit board for a display, and more particularly, to a flexible circuit board for a display, which mounts a driver in a chip-on-film structure.

BACKGROUND ART

A display device includes a timing controller, a driver and a display panel. The timing controller provides control data and display data to the driver, and the driver provides source signals corresponding to the display data to the display panel.

In general, the timing controller is mounted on a printed circuit board together with a power circuit, and the driver is mounted on a flexible circuit board in a chip-on-film structure.

Electrical connection between the printed circuit board and the flexible circuit board and electrical connection between the flexible circuit board and the display panel are implemented by an anisotropic conductive film.

The driver is generally manufactured to have a rectangular shape. Pads for communicating with the timing controller and pads for receiving input voltages are configured at one long side (hereinafter, referred to as an "input side") of the driver, and pads for providing source signals and output voltages to the display panel or receiving sensing signals obtained by sensing properties of pixels of the display panel are configured at the other long side (hereinafter, referred to as an "output side").

The flexible circuit board which mounts the driver in a chip-on-film scheme has contact pads for electrical connection with the pads of the driver, in an integrated circuit region which is defined on one surface of the flexible circuit board and in which the driver is disposed. Among the contact pads in the integrated circuit region, contact pads corresponding to the pads of the output side of the driver may be identified as integrated circuit contact pads.

Also, the flexible circuit board has panel contact pads for electrical connection with the display panel and test pads for testing of the driver, outside the integrated circuit region.

The integrated circuit contact pads and the panel contact pads are connected through connection patterns for routing on the flexible circuit board, and the panel contact pads and the test pads are connected through extension patterns for routing on the flexible circuit board.

In most cases, the connection patterns and the extension patterns of the flexible circuit board are formed on a base film and are protected by an upper cover film formed of a resin material.

The driver mounted in the integrated circuit region of the flexible circuit board is tested.

The flexible circuit board with the driver completely tested is cut along a cutting line between the panel contact pads and the test pads, for commercialization. At this time, a test connection region in which portions of the extension patterns and the test pads are formed is removed by the cutting.

By the cutting, end surfaces of the extension patterns are exposed on a cutting section.

The extension patterns are in a state in which they are connected to the connection patterns which route power, source signals and sensing signals.

In the case where the end surfaces of the extension patterns are exposed on the cutting section as described above, moisture may penetrate through the interfaces between the extension patterns and the cover film. The moisture may damage the extension patterns, and the damaged extension patterns may change electrical properties of the connection patterns.

Among power, source signals and sensing signals, the sensing signals are substantially sensitive to changes in electrical properties of the connection patterns. Thus, in the case where the extension patterns connected to the connection patterns which transfer sensing signals as important signals are damaged by penetration of moisture, changes in electrical properties of the connection patterns may be caused. In the case where the sensing signals are distorted by changes in electrical properties of the connection patterns, an influence may be exerted on an operation of the driver and a display operation.

Therefore, in the case of the flexible circuit board which mounts the driver, it is necessary to prevent electrical properties of the connection patterns from being changed by penetration of moisture through a cutting section.

DISCLOSURE

Technical Problem

Various embodiments are directed to a flexible circuit board for a display, capable of preventing a connection pattern for transferring a signal such as a sensing signal sensitive to a change in an electrical property from being changed in its electrical property by moisture penetration.

Technical Solution

In an embodiment, a flexible circuit board for a display may include: a base film divided into a product region and a test connection region based on a cutting line; integrated circuit contact pads arranged at one side of an integrated circuit region which is defined in the product region, and formed for electrical contact with an integrated circuit; panel contact pads arranged between the integrated circuit contact pads and the cutting line, and formed for electrical contact with a display panel; test pads formed in the test connection region; connection patterns electrically connecting the integrated circuit contact pads and the panel contact pads, respectively; and extension patterns extending, when at least one among the connection patterns is selected as a first connection pattern, from remaining connection patterns which are not selected as the first connection pattern, and electrically connected to the test pads, respectively.

In an embodiment, a flexible circuit board for a display may include: a base film having a cutting line; integrated circuit contact pads arranged at one side of an integrated circuit region on the base film, and formed for electrical contact with an integrated circuit; panel contact pads arranged between the integrated circuit contact pads and the cutting line, and formed for electrical contact with a display panel; connection patterns electrically connecting the integrated circuit contact pads and the panel contact pads, respectively; and extension patterns extending, when at least one among the connection patterns is selected as a first connection pattern, from remaining connection patterns which are not selected as the first connection pattern, to pass through the cutting line.

Advantageous Effects

According to the embodiments of the disclosure, a flexible circuit board for a display may prevent a connection pattern for transferring an important signal such as a sensing signal from being changed in its electrical property by moisture penetration. As a result, it is possible to secure the stability of an operation of a driver and a display operation.

MODE FOR DISCLOSURE

Figure 1:
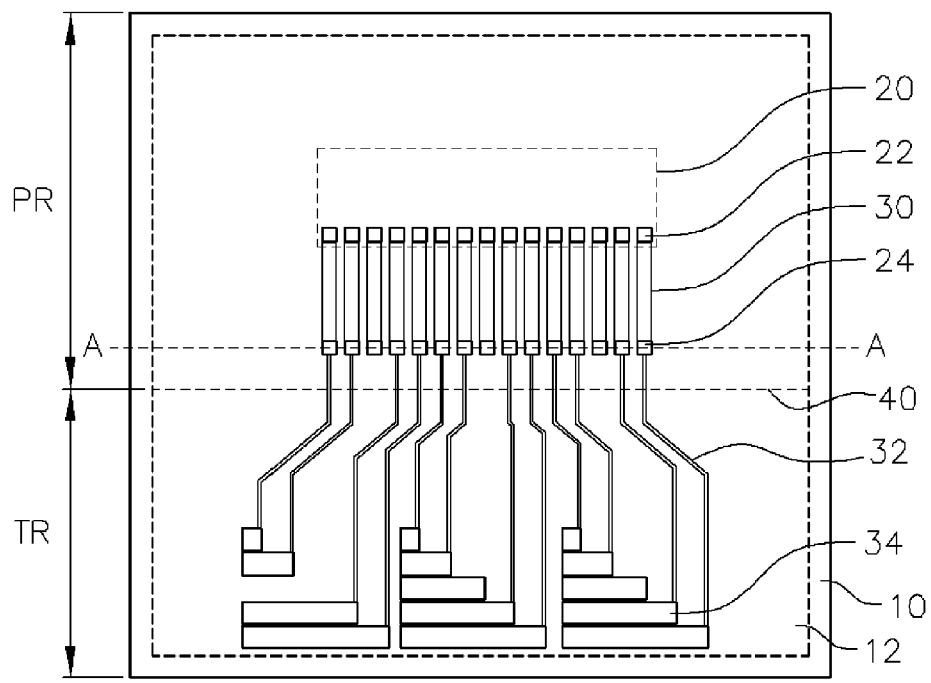
FIG. 1 is a top view illustrating a representation of an example of a flexible circuit board for a display in accordance with an embodiment of the disclosure.

Hereinafter, embodiments of the disclosure will be described in detail with reference to the accompanying drawings. The terms used herein and in the claims shall not be construed by being limited to general or dictionary meanings and shall be interpreted based on the meanings and concepts corresponding to technical aspects of the disclosure.

Embodiments described herein and configurations illustrated in the drawings are preferred embodiments of the disclosure, and, because they do not represent all of the technical features of the disclosure, there may be various equivalents and modifications that can be made thereto at the time of the present application.

The disclosure discloses an embodiment in which, in a display device using an organic light emitting diode (AMOLED), a flexible circuit board electrically connecting a display panel and a driver and mounting the driver in a chip-on-film structure is improved. By the embodiment of the disclosure, the electrical characteristic of the display device may be improved.

FIG. 1 illustrates a flexible circuit board for a display, which is divided into a product region PR and a test connection region TR based on a cutting line 40.

The flexible circuit board for a display is illustrated as being manufactured into a rectangular shape, and may be constituted in a reel type.

In the product region PR, an integrated circuit region 20 in which a driver (not illustrated) is to be mounted in a chip-on-film structure is defined. The integrated circuit region 20 may be defined into a rectangular shape which has long sides facing each other.

The flexible circuit board for a display illustrated in FIG. 1 has a structure in which pads and patterns are formed on a base film 10 and a cover film 12 is applied thereon.

The base film 10 may be constituted by an insulating film formed of a flexible material, and, in most cases, uses a polyimide film. The pads and the patterns may be formed using a conductive material such as copper. The upper cover film 12 may use a resin material, and may be formed by coating.

The pads and the patterns on the flexible circuit board may include integrated circuit contact pads 22, panel contact pads 24, test pads 34, connection patterns 30 and extension patterns 32. Among them, the connection patterns 30 and the extension patterns 32 are covered by the cover film 12, and the integrated circuit contact pads 22, the panel contact pads 24 and the test pads 34 are not covered by the cover film 12 and are exposed.

In the product region PR which is distinguished by the cutting line 40, the integrated circuit contact pads 22, the connection patterns 30, the panel contact pads 24 and portions of the extension patterns 32 are included.

In the test connection region TR which is distinguished by the cutting line 40, remaining portions of the extension patterns 32 and the test pads 34 are formed.

In the integrated circuit region 20, integrated circuit contact pads corresponding to pads of an input side and pads of an output side of the driver mounted in the chip-on-film structure may be formed. In the embodiment of the disclosure, for the sake of convenience in explanation, the illustration of integrated circuit contact pads corresponding to the pads of the input side of the driver is omitted, and the integrated circuit contact pads 22 corresponding to the pads of the output side of the driver are illustrated in the integrated circuit region 20.

The integrated circuit contact pads 22 may be arranged at positions adjacent to one long side of the integrated circuit region 20 to be parallel to the one long side. In detail, the integrated circuit contact pads 22 are arranged in a line in a state in which they are separated from one another, to correspond to positions where the pads of the output side of the driver are disposed, and are positioned in the integrated circuit region 20.

The panel contact pads 24 are formed outside the integrated circuit region 20, and are arranged between the integrated circuit contact pads 22 and the cutting line 40. The panel contact pads 24 are formed for electrical contact with a display panel. In detail, the panel contact pads 24 are arranged in a line in a state in which they are separated from one another, at positions that are parallel to the integrated circuit contact pads 22 and are adjacent to the cutting line 40.

The connection patterns 30 are formed to electrically connect the integrated circuit contact pads 22 and the panel contact pads 24, respectively. The connection patterns 30 may be constituted to have the same line width and be separated from one another.

The respective connection patterns 30 are constituted such that one ends thereof are brought into electrical contact with the integrated circuit contact pads 22, respectively, and the other ends thereof are brought into electrical contact with the panel contact pads 24, respectively. For this, the respective connection patterns 30 may have the one ends on which the integrated circuit contact pads 22 are formed to be brought into electrical contact and the other ends on which the panel contact pads 24 are formed to be brought into electrical contact. This will be described below with reference to FIG. 2.

In the test connection region TR which is distinguished by the cutting line 40, the test pads 34 are formed.

The extension patterns 32 are constituted to electrically connect the connection patterns 30 and the test pads 34, respectively. The extension patterns 32 may be constituted to have the same line width and be separated from one another.

Specifically, at least one among the connection patterns 30 formed in the product region PR may be defined as a first connection pattern, and the extension patterns are constituted to electrically connect remaining connection patterns 30 which are not selected as the first connection pattern, with corresponding test pads 34, respectively.

The test pads 34 are distributedly disposed at various positions of the test connection region TR to be brought into physical contact with test needles (or pins) constituting test equipment or a test card, and are constituted to have various areas at respective positions.

For instance, the test pads 34 may be disposed in a matrix structure which has rows and columns. As a distance from the cutting line 40 increases, areas of the test pads 34 may increase.

The extension patterns 32 may be formed to have bent routing patterns for electrical connection with the test pads 34 which have various positions and areas.

Figure 2:
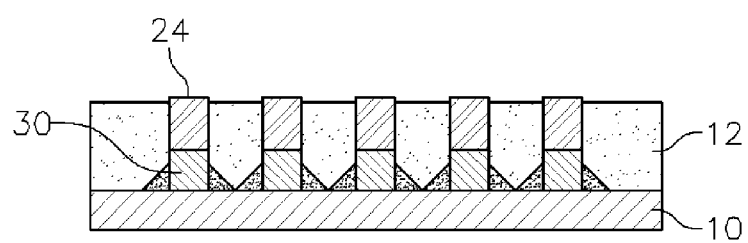
FIG. 2 is a cross-sectional view taken along the line A-A of FIG. 1.

In the above-described configuration, the constitutions of the connection patterns 30 and the panel contact pads 24 will be described below with reference to FIG. 2. FIG. 2 is a cross-sectional view taken along the line A-A of FIG. 1.

The connection patterns 30 are formed on the base film 10 to be separated from one another by a predetermined distance, and the panel contact pads 24 are formed on the connection patterns 30.

The connection patterns 30 and the panel contact pads 24 may be formed using the same conductive material or different conductive materials, and may be shaped by various methods such as wet etching.

After the connection patterns 30 and the panel contact pads 24 are formed, the cover film 12 is applied by coating to cover the connection patterns 30 and the base film 10.

Meanwhile, the extension patterns 32 may be formed to integrally extend from the connection patterns 30 and have a width narrower than the connection patterns 30.

Figure 3:
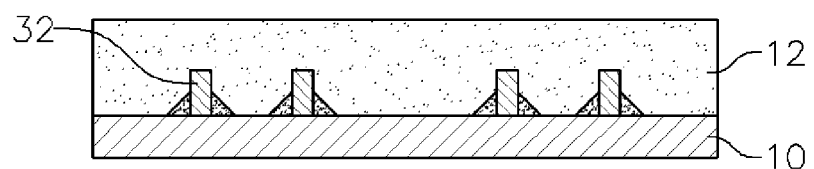
FIG. 3 is a cross-sectional view taken along a cutting line 40 of FIG. 1.

Referring to FIG. 3, it may be appreciated that the extension patterns 32 are formed on the base film 10 to be separated from one another by a predetermined distance. The extension patterns 32 are covered by the cover film 12. FIG. 3 is a cross-sectional view taken along the cutting line 40.

The connection patterns 30 are formed to be confined within the product region PR while not reaching the cutting line 40. That is to say, the entire connection patterns 30 are formed to have a length that is not exposed on the cutting section of FIG. 3 after cutting is performed along the cutting line 40.

Among the connection patterns 30, a connection pattern which transfers an important signal such as a sensing signal obtained by sensing information on the property of a pixel of the display panel may be defined as the first connection pattern.

The connection patterns 30 may be divided into ones for transferring power, ones for transferring source signals and ones for transferring sensing signals.

In the embodiment of the disclosure, all connection patterns 30 which transfer sensing signals may be defined as first connection patterns.

In detail, in the embodiment of the disclosure, the extension patterns 32 may be integrally connected to ends of remaining connection patterns 30, facing the cutting line 40, except the connection patterns 30 which transfer sensing signals. On the other hand, the extension patterns 32 are not formed at ends of the connection patterns 32 which transfer sensing signals, facing the cutting line 40.

The extension patterns 32 are connected to the test pads 34, respectively, through the cutting line 40.

Therefore, as illustrated in FIG. 3, in the case where the base film 10 is cut along the cutting line 40, the connection patterns 30 which transfer sensing signals are not exposed on the cutting section, and ends of the extension patterns 32 which are connected to the connection patterns 30 for transferring source signals or power are exposed on the cutting section.

As a result, in the present disclosure, since the extension patterns 32 are not connected to the connection patterns 30 which transfer sensing signals, it is possible to prevent moisture from penetrating through the extension patterns 32, and it is possible to prevent electrical properties of the connection patterns 30 which transfer sensing signals, from being changed by penetration of moisture.

Therefore, according to the present disclosure, it is possible to secure the stability of an operation of a source driver and a display operation.

While various embodiments have been described above, it will be understood to those skilled in the art that the embodiments described are by way of example only. Accordingly, the disclosure described herein should not be limited based on the described embodiments.

The invention claimed is:

1. A flexible circuit board for a display, comprising:
   a base film divided into a product region and a test connection region based on a cutting line;
   integrated circuit contact pads arranged at one side of an integrated circuit region which is defined in the product region, and formed for electrical contact with an integrated circuit;
   panel contact pads arranged between the integrated circuit contact pads and the cutting line, and formed for electrical contact with a display panel;
   test pads formed in the test connection region;
   connection patterns electrically connecting the integrated circuit contact pads and the panel contact pads, respectively, and divided into a first connection pattern, which is selected at least one among the connection patterns, and remaining connection patterns, which are not selected as the first connection pattern; and
   extension patterns extending from the remaining connection patterns and electrically connected to the test pads, respectively,
   wherein the extension patterns are formed integrally with the connection patterns, respectively, and have a width narrower than the connection patterns.

2. The flexible circuit board according to claim 1, wherein the first connection pattern is formed to be confined within the product region while not reaching the cutting line.

3. The flexible circuit board according to claim 1, wherein the first connection pattern has a length that is not exposed on a cutting section after cutting is performed along the cutting line.

4. The flexible circuit board according to claim 1, wherein the first connection pattern is one which transfers a sensing signal obtained by sensing information on a property of a pixel.

5. The flexible circuit board according to claim 1, wherein the panel contact pads are formed outside the integrated circuit region, and are formed in a line adjacent to the cutting line.

6. The flexible circuit board according to claim 1,
   wherein first integrated circuit contact pads corresponding to first pads of an input side of a driver mounted in the integration circuit region in a chip-on-film structure and second integrated circuit contact pads corresponding to second pads of an output side of the driver are formed, and
   wherein the integrated circuit contact pads correspond to the second integrated circuit contact pads.

7. A flexible circuit board for a display, comprising:
   a base film having a cutting line;
   integrated circuit contact pads arranged at one side of an integrated circuit region on the base film, and formed for electrical contact with an integrated circuit;

panel contact pads arranged between the integrated circuit contact pads and the cutting line, and formed for electrical contact with a display panel;

connection patterns electrically connecting the integrated circuit contact pads and the panel contact pads, respectively, and divided into a first connection pattern, which is selected at least one among the connection patterns, and remaining connection patterns, which are not selected as the first connection patterns; and extension patterns extending from the remaining connection patterns to pass through the cutting line, wherein the extension patterns are formed integrally with the connection patterns, respectively, and have a width narrower than the connection patterns.

8. The flexible circuit board according to claim 7, wherein the first connection pattern has a length that is not exposed on a section of the cutting line.

9. The flexible circuit board according to claim 7, wherein the first connection pattern is one which transfers a sensing signal obtained by sensing information on a property of a pixel.

10. The flexible circuit board according to claim 7, wherein the panel contact pads are formed outside the integrated circuit region, and are formed in a line adjacent to the cutting line.

11. The flexible circuit board according to claim 7, wherein first integrated circuit contact pads corresponding to first pads of an input side of a driver mounted in the integration circuit region in a chip-on-film structure and second integrated circuit contact pads corresponding to second pads of an output side of the driver are formed, and wherein the integrated circuit contact pads correspond to the second integrated circuit contact pads.

12. The flexible circuit board according to claim 7, wherein cutting sections of the extension patterns are exposed at the cutting line.

\* \* \* \* \*